(12) United States Patent
Bachen

(10) Patent No.: US 7,141,991 B2
(45) Date of Patent: Nov. 28, 2006

(54) INSTRUMENTATION CURRENT LOOP

(76) Inventor: Patrick Bachen, 10731-133 Street, Edmonton, Alberta (CA) T5M 1G7

(*) Notice: Subject to any disclaimer, the term of this patent is extended or adjusted under 35 U.S.C. 154(b) by 0 days.

(21) Appl. No.: 10/945,531

(22) Filed: Sep. 20, 2004

(65) Prior Publication Data
US 2005/0285607 A1    Dec. 29, 2005

(51) Int. Cl.
     *G01R 17/10*      (2006.01)
     *G01R 27/08*      (2006.01)
(52) U.S. Cl. ..................... 324/725; 324/706
(58) Field of Classification Search ................. 324/725
See application file for complete search history.

(56) References Cited

U.S. PATENT DOCUMENTS

| | | | | |
|---|---|---|---|---|
| 2,323,076 A | * | 6/1943 | Erich | 324/645 |
| 3,228,240 A | * | 1/1966 | Ormond | 73/862.622 |
| 3,464,004 A | * | 8/1969 | Nobis | 324/610 |
| 3,654,550 A | * | 4/1972 | Ward | 324/706 |
| 3,757,211 A | * | 9/1973 | Goto | 324/671 |
| 4,143,317 A | * | 3/1979 | Pogue et al. | 324/103 P |
| 4,625,175 A | * | 11/1986 | Smith | 324/430 |
| 5,764,067 A | * | 6/1998 | Rastegar | 324/725 |
| 6,559,661 B1 | * | 5/2003 | Muchow et al. | 324/725 |

OTHER PUBLICATIONS

Definition of "Voltage Reference" from Wikipedia.org, 1 pg, Jul. 9, 2006.*
Anderson, K, "The constant current loop: A new paradigm for resistance signal conditioning", Instrument Society of America, 39th International Instrumentation Symposium, May 3-6, 1993, Albuquerque, NM.

* cited by examiner

*Primary Examiner*—Anjan Deb
*Assistant Examiner*—Jeff Natalini
(74) *Attorney, Agent, or Firm*—Christensen O'Connor Johnson Kindness PLLC

(57) ABSTRACT

An instrumentation current loop, including a transducer having transducer output terminals. A power source is connected in series to the transducer. A bridge has a first arm and a second arm extending between a pair of input terminals, where the input terminals of the bridge are connected to the transducer output terminals. The first arm comprises a first resistance and a second resistance connected via a first junction. The second arm comprises a third resistance and a fourth resistance providing a voltage reference connected via a second junction. A meter is connected between the first junction and the second junction. Values of the first, second, third and fourth resistance are selected so that a given range of input current provided by the transducer output terminals and supplied to the input terminals of the bridge is converted to a desired range of output current for the meter.

23 Claims, 4 Drawing Sheets

INSTRUMENTATION CURRENT LOOP

FIELD OF THE INVENTION

The present invention relates to an instrumentation current loop, which is capable of operating without a separate power source.

BACKGROUND OF THE INVENTION

Whenever equipment is operated in a remote location, providing a separate power supply to power the gauges involves an additional expense. It is, therefore, preferable that the gauge derive its power from the conductive loop to which it is connected.

SUMMARY OF THE INVENTION

What is required is an instrumentation current loop.

According to the present invention there is provided instrumentation current loop, comprising a transducer having transducer output terminals; a power source; a bridge having a first arm and a second arm extending between a pair of input terminals, the input terminals of the bridge being connected to the transducer output terminals and to the power source as a current loop; the first arm comprising a first resistance and a second resistance connected via a first junction; the second arm comprising a third resistance and a fourth resistance providing a voltage reference connected via a second junction; a meter connected between the first junction and the second junction; a meter connected between the first junction and the second junction; and values of the first, second, third and fourth resistance being selected so that a given range of input current provided by the transducer output terminals and supplied to the input terminals of the bridge is converted to a desired range of output current for the meter.

More beneficial aspects will be apparent from a reading of the description and claims.

BRIEF DESCRIPTION OF THE DRAWINGS

These and other features of the invention will become more apparent from the following description in which reference is made to the appended drawings, the drawings are for the purpose of illustration only and are not intended to in any way limit the scope of the invention to the particular embodiment or embodiments shown, wherein.

DETAILED DESCRIPTION OF THE PREFERRED EMBODIMENT

Figure 1:
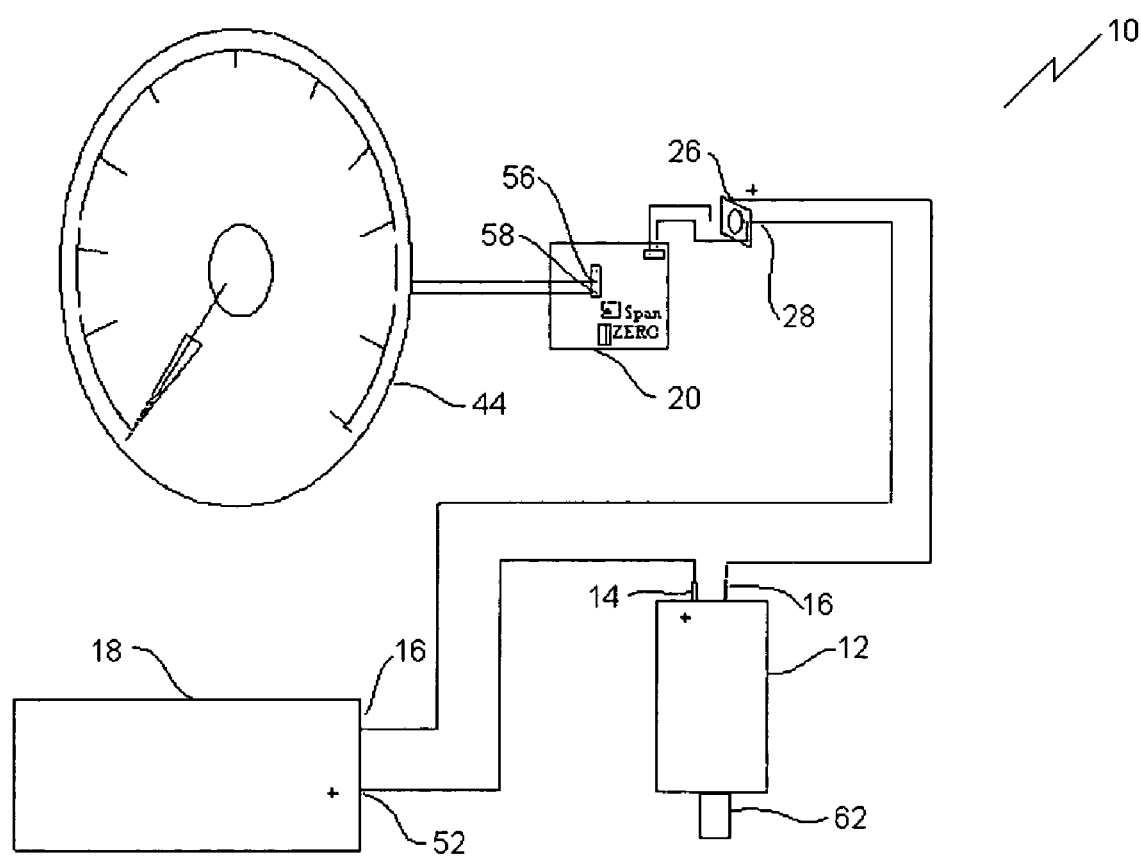
FIG. 1 is a block diagram of the instrumentation current loop according to the teachings of the invention.

The preferred embodiment, an instrumentation current loop generally identified by reference numeral 10, will now be described with reference to FIGS. 1 through 4.

Figure 2:
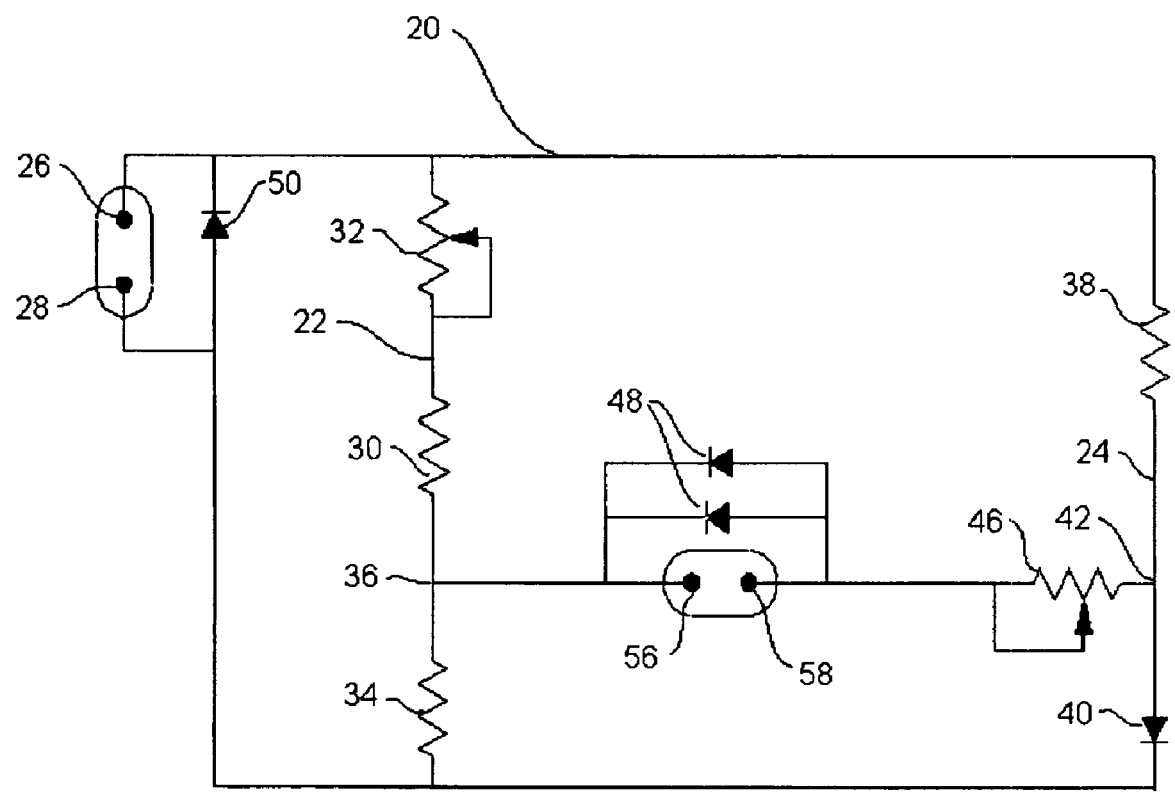
FIG. 2 is a schematic diagram of the bridge circuit.
Figure 3:
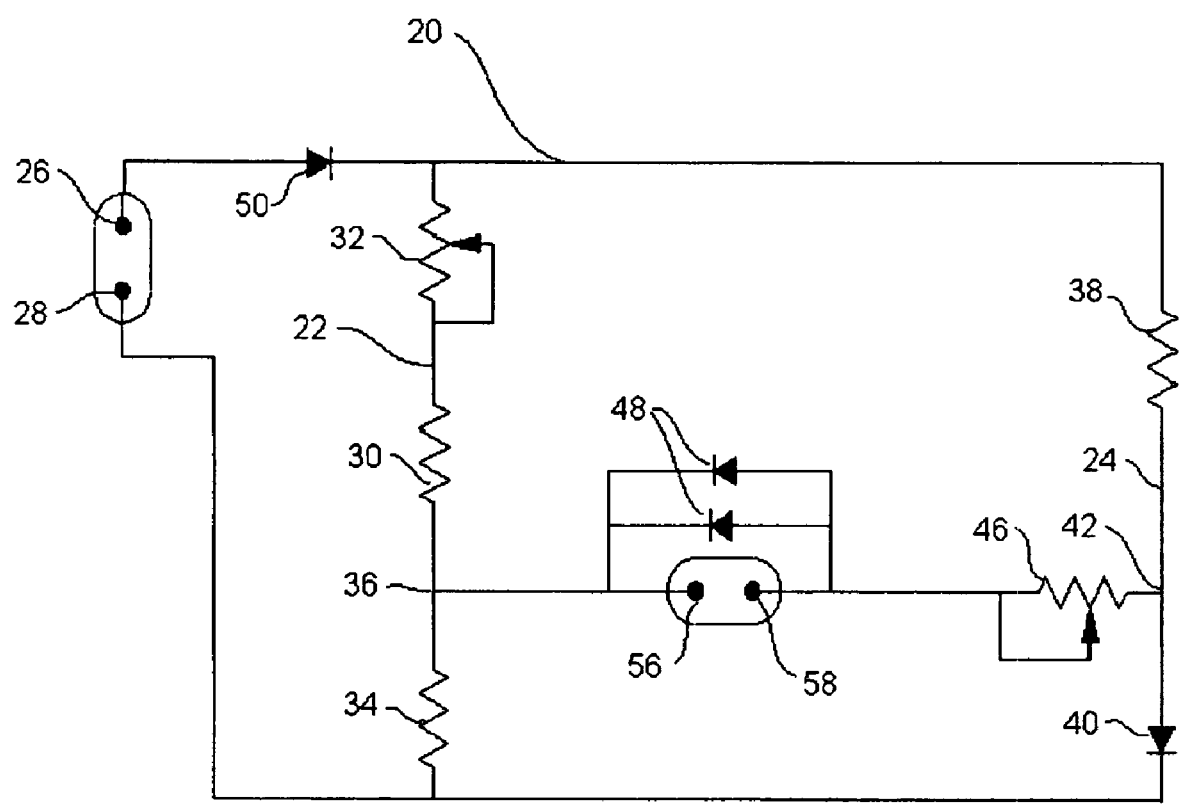
FIG. 3 is an alternative schematic diagram of the bridge circuit of FIG. 2.

Structure and Relationship of Parts:

Referring now to FIG. 1, there is shown instrumentation current loop 10 including a transducer 12 having transducer output terminals 14 and 16, and an input terminal 62. The term transducer as used in this application is used in its broadest sense, and may refer to any device or element which converts an input signal into an electrical output signal, for example, a strain gauge, thermocouple, piezoelectric crystal, microphone, photoelectric cell, etc. A power source 18 is connected in series to transducer 12. The positive terminal 52 of power source 18 is connected to the positive terminal 14 of transducer 12, and the negative terminal 16 of power source 18 is connected to the negative terminal 28 of a bridge 20. The negative terminal 14 of transducer 12 is connected to the positive terminal 26 of bridge 20. In this arrangement, transducer 12, power source 18 and bridge 20 form a current loop. Bridge 20 controls a meter 44 to display the readings. Meter 44 may comprise a moving needle as shown, or it may have a digital readout. Alternatively, meter 44 may be connected to a computer to record data directly. In these situations, meter 44 would have the necessary circuitry, which is known in the art. Referring now to FIG. 2, bridge 20 is shown in more detail. Bridge 20 has a first arm 22, a second arm 24, and a pair of input terminals 26 and 28 connected to transducer output terminal 14 and power supply terminal 16 as described previously. As depicted, first arm 22 has a first resistance made up of a resistor 30 and a potentiometer 32, and a second resistance made up of a resistor 34 connected via a first junction 36. Second arm 24 has a third resistance made up of a resistor 38 and a fourth resistance including forward biased diode 40 that provides a voltage reference connected via a second junction 42. Referring again to FIG. 1, meter 44 is connected to output terminals 56 and 58, which are, referring to FIG. 2, between first junction 36 and second junction 42. A potentiometer 46 is connected in series with meter 44 between first junction 36 and second junction 42 to provide a variable range of output current from bridge 20. Values of resistors 30, 34, and 38, potentiometer 32, and diode 40 are selected so that a given range of input current, for example 4 to 20 mA, provided by transducer output terminal 14 and 16, and supplied to input terminals 26 and 28 of bridge 20 is converted to a desired range of output current for meter 44.

Referring again to FIG. 1, a discussion of the resistances will be given. Potentiometers 32 and 46 are included to provide a variable resistance such that bridge 20 may be adjusted. Since the role of potentiometer 32 is to adjust the bridge, it may be included in the second resistance instead of the first, or in both. Both potentiometers 32 and 46 are accessible without disassembling the apparatus, where potentiometer 32 is used to set the zero point, and potentiometer 46 is used to set the range, or span of input currents. In choosing the values of the resistance, the following rule is generally followed: the ratio of the value of the first resistance (resistor 30 and potentiometer 32) to the value of the second resistance (resistor 34) is equal to the ratio of the value of the third resistance (resistor 38) to the value of the fourth resistance (diode 40). As diodes do not have a specific resistance, an effective resistance is used based upon the current and voltage drop as a reference current.

Meter 44 is protected by two diodes 48, one of which is redundant, connected in parallel to meter 44 between the first junction and the second junction, biased such that they shunt the back EMF of meter 44 movement if it should be disconnected while live. Another diode 50 is connected to bridge input terminals 26 and 28 as reverse protection. In FIG. 2, diode 50 is shown connected across input terminals 26 and 28, and in FIG. 3, diode 50 is shown connected in series with input terminals 26 and 28. Either or both configurations may be used, however, with the latter configuration, an additional voltage drop is incurred in the circuit.

Figure 4:
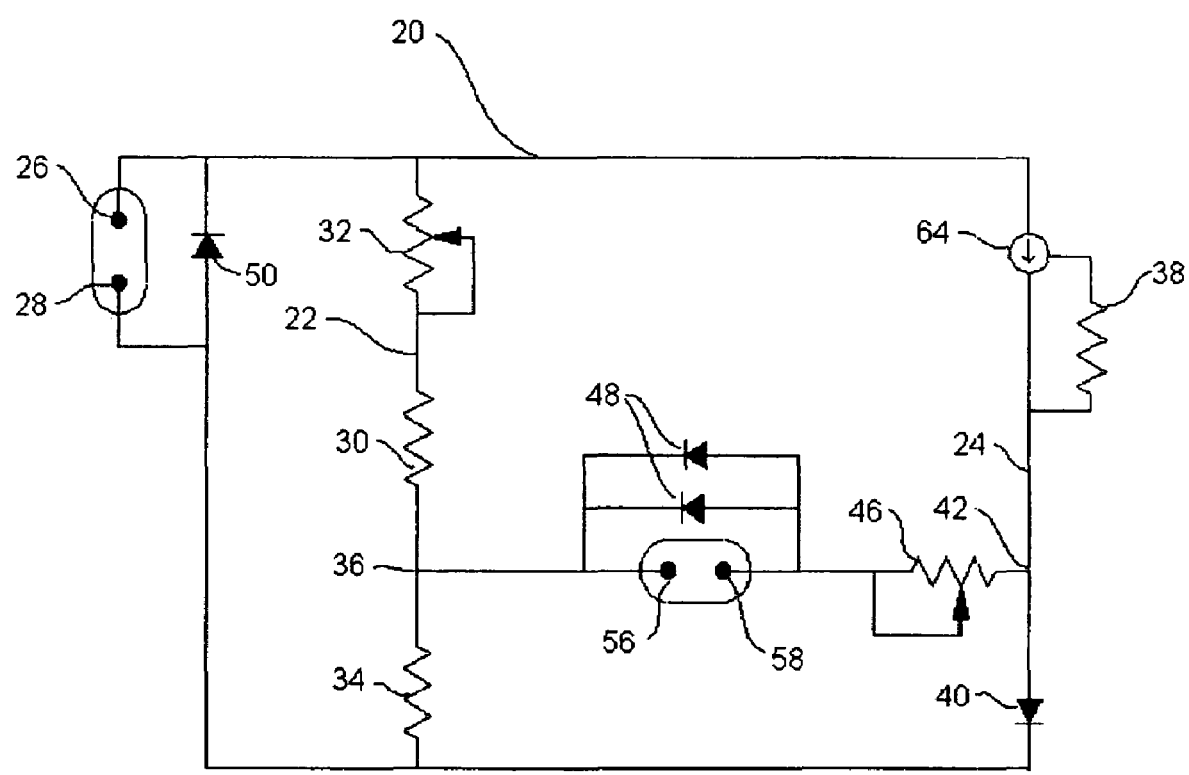
FIG. 4 is an alternative schematic diagram of the bridge circuit of FIG. 2.

Referring now to FIG. 4, a current source 64, such as a component in the LMX34 series, may be included in the third resistance, where the value of resistor 30 is used to set the current through second arm 24.

As an example, instrumentation current loop may be designed to operate with 12 to 30$V_{DC}$ from power supply 18, and transducer 12 calibrated for a range of 4 to 20 mA of current, such as, if instrumentation current loop 10 is used to measure weight, for a range of 0 to 10,000 lbs. In this situation, the following components may be used:

Resistor 30=100 Ω
Potentiometer 32=100 Ω
Resistor 34=200 Ω
Resistor 38=330 Ω
Potentiometer (variable resistor) 46=2 KΩ
Diodes 40, 48 and 50 are 1N4001 or equivalent, and are assumed to have an approximately constant voltage drop for the current ranges encountered by the device.

Operation:

The use of instrumentation current loop 10 will now be described with reference to FIGS. 1 through 4. Referring now to FIG. 2, the components in bridge 20 are connected together as described previously. Upon applying 4 mA to bridge 20, resistor 38 (330 Ω) acts as a current source of 1.5 mA to forward bias diode 40. This establishes a reference potential across diode 40 of approximately 0.50 volts. The remaining 2.5 mA flows through resistor 30 (100 Ω), potentiometer 32 (0 to 100 Ω), and resistor 34 (200 Ω). The potential across resistor 34 is set for 0.50 V via potentiometer 30. Meter 44 is connected between first junction 36 and potentiometer 46 (2 KΩ). The other end of potentiometer 46 is connected to second junction 42. In this configuration, meter 44 will indicate 0 or no deflection at an input current of 4 mA. As the current increases, the potential at first junction 36 increases much more than second junction 42. Thus meter 44 begins to deflect and conduct additional current through diode 40. This current does not increase the voltage appreciably across diode 40. Potentiometer 46 is adjusted to set the full-scale deflection of the movement of meter 40. Potentiometer 46 can adjust full scale of a 1 mA meter movement from approximately 7.5 mA to well in excess of 20 mA. Diode 50 serves as a reverse protection diode in case gauge 60 is connected backwards. Diodes 48 shunt the back EMF of meter 40 should it be disconnected while live. Referring to FIG. 1, transducer 12 is connected to power supply 18 and gauge 60 as described previously. Power supply 18 supplies the necessary voltage in instrumentation current loop 10. Transducer 12 supplies a current in response to what is being measured, according to what is received from transducer input 62. For example, if weight is measured, a higher output current would correspond to a higher weight. The output current is input into bridge 20. Meter 44 is controlled based on the input current into bridge 20, as described above.

Once the teachings of the present invention are understood, it will be apparent to one skilled in the art that it does not matter what is being measured by the gauge. The gauge could be measuring pressure, weight, light, movement, temperature, etc. with an appropriately scaled meter 44.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent to one skilled in the art that modifications may be made to the illustrated embodiment without departing from the spirit and scope of the invention as hereinafter defined in the Claims.

The embodiments of the invention in which an exclusive property or privilege is claimed are defined as follows:

1. An instrumentation current loop, comprising:
a transducer having transducer output terminals;
a power source;
a bridge having a first arm and a second arm extending between a pair of input terminals, the input terminals of the bridge being connected to the transducer output terminals and to the power source as a current loop;
the first arm comprising a first resistance and a second resistance connected via a first junction;
the second arm comprising a third resistance and a fourth resistance providing a voltage reference connected via a second junction;
a meter connected between the first junction and the second junction; and
values of the first, second, third and fourth resistance being selected so that a given range of input current provided by the transducer output terminals and supplied to the input terminals of the bridge is converted to a desired range of output current for the meter.

2. The instrumentation current loop of claim 1, further comprising a variable resistance in series with the meter between the first junction and the second junction to provide a variable range of output current from the bridge.

3. The instrumentation current loop of claim 2, in which the fourth resistance is a forward biased diode.

4. The instrumentation current loop of claim 3, in which the third resistance provides a current source.

5. The instrumentation current loop of claim 3, in which the ratio of the value of the first resistance to the value of the second resistance is equal to the ratio of the value of the third resistance to the value of the fourth resistance.

6. The instrumentation current loop of claim 3, in which at least one of the first resistance and the second resistance is a variable resistance.

7. The instrumentation current loop of claim 6, in which the meter is protected by a diode connected in parallel to the meter between the first junction and the second junction.

8. The instrumentation current loop of claim 7, in which a diode is connected to the bridge input terminals as reverse protection.

9. The instrumentation current loop of claim 2, in which the third resistance provides a current source.

10. The instrumentation current loop of claim 9, in which the ratio of the value of the first resistance to the value of the second resistance is equal to the ratio of the value of the third resistance to the value of the fourth resistance.

11. The instrumentation current loop of claim 9, in which at least one of the first resistance and the second resistance is a variable resistance.

12. The instrumentation current loop of claim 11, in which the meter is protected by a diode connected in parallel to the meter between the first junction and the second junction.

13. The instrumentation current loop of claim 12, in which a diode is connected to the bridge input terminals as reverse protection.

14. The instrumentation current loop of claim 2, in which the ratio of the value of the first resistance to the value of the second resistance is equal to the ratio of the value of the third resistance to the value of the fourth resistance.

15. The instrumentation current loop of claim 14, in which at least one of the first resistance and the second resistance is a variable resistance.

16. The instrumentation current loop of claim 15, in which the meter is protected by a diode connected in parallel to the meter between the first junction and the second junction.

17. The instrumentation current loop of claim 16, in which a diode is connected to the bridge input terminals as reverse protection.

18. The instrumentation current loop of claim 2, in which at least one of the first resistance and the second resistance is a variable resistance.

19. The instrumentation current loop of claim 18, in which the meter is protected by a diode connected in parallel to the meter between the first junction and the second junction.

20. The instrumentation current loop of claim 19, in which a diode is connected to the bridge input terminals as reverse protection.

21. The instrumentation current loop of claim 1, in which at least one of the first resistance and the second resistance is a variable resistance.

22. The instrumentation current loop of claim 21, in which the meter is protected by a diode connected in parallel to the meter between the first junction and the second junction.

23. The instrumentation current loop of claim 22, in which a diode is connected to the bridge input terminals as reverse protection.

* * * * *

UNITED STATES PATENT AND TRADEMARK OFFICE
CERTIFICATE OF CORRECTION

PATENT NO. : 7,141,991 B2  Page 1 of 1
APPLICATION NO. : 10/945531
DATED : November 28, 2006
INVENTOR(S) : P. Bachen It is certified that error appears in the above-identified patent and that said Letters Patent is hereby corrected as shown below:

| COLUMN | LINE | ERROR |
|---|---|---|
| (30) Pg 1., col. 1 | Foreign Application Priority Data | insert in appropriate order --(30) Foreign Application Priority Data Jun. 23, 2004 CA 2473030-- |

Signed and Sealed this

Twenty-seventh Day of March, 2007

JON W. DUDAS
*Director of the United States Patent and Trademark Office*